(12) United States Patent
Nie et al.

(10) Patent No.: US 8,823,140 B2
(45) Date of Patent: Sep. 2, 2014

(54) GAN VERTICAL BIPOLAR TRANSISTOR (71) Applicant: Avogy, Inc., San Jose, CA (US)

(72) Inventors: Hui Nie, Cupertino, CA (US); Andrew Edwards, San Jose, CA (US); Isik Kizilyalli, San Francisco, CA (US); Dave Bour, Cupertino, CA (US)

(73) Assignee: Avogy, Inc., San Jose, CA (US)

( * ) Notice: Subject to any disclaimer, the term of this patent is extended or adjusted under 35 U.S.C. 154(b) by 0 days.

(21) Appl. No.: 13/675,916

(22) Filed: Nov. 13, 2012

(65) Prior Publication Data

US 2014/0131837 A1 May 15, 2014

(51) Int. Cl.
*H01L 29/66* (2006.01)
(52) U.S. Cl.
USPC ............. 257/565; 438/309; 257/E21.608
(58) Field of Classification Search
USPC ............. 257/565, 552, 163; 438/309
See application file for complete search history.

(56) References Cited

U.S. PATENT DOCUMENTS

2004/0251515 A1* 12/2004 Yang et al. .............. 257/552

* cited by examiner

*Primary Examiner* — Mohsen Ahmadi
*Assistant Examiner* — Reema Patel
(74) *Attorney, Agent, or Firm* — Kilpatrick Townsend & Stockton LLP (57) ABSTRACT

An embodiment of a semiconductor device includes a III-nitride base structure of a first conductivity type, and a III-nitride emitter structure of a second conductivity type having a first surface and a second surface. The second surface is substantially opposite the first surface. The first surface of the III-nitride emitter structure is coupled to a surface of the III-nitride base structure. The semiconductor also includes a first dielectric layer coupled to the second surface of the III-nitride emitter structure, and a spacer coupled to a sidewall of the III-nitride emitter structure and the surface of the III-nitride base structure. The semiconductor also includes a base contact structure with a III-nitride material coupled to the spacer, the surface of the III-nitride base structure, and the first dielectric layer, such that the first dielectric layer and the spacer are disposed between the base contact structure and the III-nitride emitter structure.

21 Claims, 13 Drawing Sheets

GAN VERTICAL BIPOLAR TRANSISTOR

BACKGROUND OF THE INVENTION

Power electronics are widely used in a variety of applications. Power electronic devices are commonly used in circuits to modify the form of electrical energy, for example, from ac to dc, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same.

SUMMARY OF THE INVENTION

The present invention relates generally to electronic devices. More specifically, the present invention relates to forming vertical bipolar transistors. Merely by way of example, the invention has been applied to methods and systems for manufacturing vertical heterojunction bipolar transistor (HBT) using gallium-nitride (GaN) and indium-gallium-nitride (InGaN)-based epitaxial layers. The methods and techniques can be applied to a variety of bipolar transistors including npn and pnp vertical bipolar transistors, which can include HBTs, bipolar junction transistors (BJTs), or the like.

An embodiment of a method for fabricating a vertical bipolar transistor, according to the disclosure, can include providing a III-nitride base structure of a first conductivity type, and forming a III-nitride emitter structure of a second conductivity type having a first surface and a second surface, where the second surface is substantially opposite the first surface. The first surface of the III-nitride emitter structure can be coupled to a surface of the III-nitride base structure. A first dielectric layer can be coupled to the second surface of the III-nitride emitter structure, and the III-nitride emitter structure can have a sidewall adjacent to an exposed portion of the surface of the III-nitride base structure. The method can further include forming a spacer coupled to the sidewall of the III-nitride emitter structure and the exposed portion of the surface of the III-nitride base structure, and forming a base contact structure comprising a III-nitride material coupled to the spacer, the exposed portion of the surface of the III-nitride base structure, and the first dielectric layer such that the first dielectric layer and the spacer are disposed between the base contact structure and the III-nitride emitter structure.

An embodiment of a semiconductor device, according to the disclosure, can include a III-nitride base structure of a first conductivity type, and a III-nitride emitter structure of a second conductivity type having a first surface and a second surface. The second surface can be substantially opposite the first surface. The first surface of the III-nitride emitter structure can be coupled to a surface of the III-nitride base structure. A first dielectric layer can be coupled to the second surface of the III-nitride emitter structure. A spacer can be coupled to a sidewall of the III-nitride emitter structure and the surface of the III-nitride base structure. The semiconductor can further include base contact structure comprising a III-nitride material coupled to the spacer, the surface of the III-nitride base structure, and the first dielectric layer, such that the first dielectric layer and the spacer are disposed between the base contact structure and the III-nitride emitter structure Another embodiment of a method for fabricating a vertical bipolar transistor, according to the disclosure, can include providing a first III-nitride layer of a first conductivity type, forming at least one III-nitride layer of a second conductivity type coupled to the first III-nitride layer, and forming a first dielectric layer coupled to the at least one III-nitride layer. The method can further include removing at least a portion of the first dielectric layer and the at least one III-nitride layer to expose a surface of the first III-nitride layer, and form a layered structure comprising at least a portion of the at least one III-nitride layer and the first dielectric layer. The method can also include forming a spacer coupled to a sidewall of the layered structure, and forming a second III-nitride layer of the first conductivity type coupled to the spacer, the exposed surface of the first III-nitride layer, and the first dielectric layer, such that the first dielectric layer and the spacer are disposed between the second III-nitride layer and the at least one III-nitride layer Numerous benefits are achieved by way of the present invention over conventional techniques. For example, embodiments of the present invention utilize spacers and passivation to reduce emitter/base recombination current. Additionally, embodiments of the present invention provide for self-aligned base contact structures that maximize contact to the base layer, reducing contact resistance. Furthermore, embodiments can integrate of Junction Termination Extension (JTE) structures for reliable high-voltage operation. These and other embodiments of the invention, along with many of its advantages and features, are described in more detail in conjunction with the text below and attached figures.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF SPECIFIC EMBODIMENTS

The present invention relates generally to electronic devices. More specifically, the present invention relates to forming vertical bipolar transistors. Merely by way of example, the invention has been applied to methods and systems for manufacturing vertical heterojunction bipolar transistor (HBT) using gallium-nitride (GaN) and indium-gallium-nitride (InGaN)-based epitaxial layers. The methods and techniques can be applied to a variety of bipolar transistors including npn and pnp vertical bipolar transistors, which can include HBTs, bipolar junction transistors (BJTs), or the like.

GaN-based electronic and optoelectronic devices are undergoing rapid development. Desirable properties associated with GaN and related alloys and heterostructures include high bandgap energy for visible and ultraviolet light emission, favorable transport properties (e.g., high electron mobility and saturation velocity), a high breakdown field, and high thermal conductivity. According to embodiments of the present invention, gallium nitride (GaN) epitaxy on pseudo-bulk GaN substrates is utilized to fabricate vertical GaN-based semiconductor devices not possible using conventional techniques. For example, conventional methods of growing GaN include using a foreign substrate such as silicon carbide (SiC). This can limit the thickness of a usable GaN layer grown on the foreign substrate due to differences in thermal expansion coefficients and lattice constant between the GaN layer and the foreign substrate. High defect densities at the interface between GaN and the foreign substrate further complicate attempts to create vertical devices, including power electronic devices such as JFETs and other field-effect transistors.

Homoepitaxial GaN layers on bulk GaN substrates, on the other hand, are utilized in the embodiments described herein to provide superior properties to conventional techniques and devices. For instance, electron mobility, $\mu$, is higher for a given background doping level, N. This provides low resistivity, $\rho$, because resistivity is inversely proportional to electron mobility, as provided by equation (1):

$$\rho = \frac{1}{q\mu N}, \quad (1)$$

where q is the elementary charge.

Another superior property provided by homoepitaxial GaN layers on bulk GaN substrates is high critical electric field for avalanche breakdown. A high critical electric field allows a larger voltage to be supported over smaller length, L, than a material with a lower critical electric field. A smaller length for current to flow together with low resistivity give rise to a lower resistance, R, than other materials, since resistance can be determined by the equation:

$$R = \frac{\rho L}{A}, \quad (2)$$

where A is the cross-sectional area of the channel or current path.

In general, a tradeoff exists between the physical dimension of a device needed to support high voltage in a device's off-state and the ability to pass current through the same device with low resistance in the on-state. In many cases GaN is preferable over other materials in minimizing this tradeoff and maximizing performance. In addition, GaN layers grown on bulk GaN substrates have low defect density compared to layers grown on mismatched substrates. The low defect density will give rise to superior thermal conductivity, less trap-related effects such as dynamic on-resistance, and better reliability.

Among the vertical device structures contemplated is a vertical bipolar transistor, such as a BJT and/or HBT. Such GaN-based bipolar transistors could be used in high-power and/or high-temperature operations. Problematically, however, bipolar transistors can suffer from a variety of issues that would inhibit these operations. For example, bipolar transistors often can have a highly resistive base layer due to low ionization of magnesium (Mg) doping. This can also lead to high emitter crowding effect due to high base sheet resistance. Bipolar transistors can have poor Ohmic contact with as-grown and/or as-etched GaN or InGaN base contacts. Furthermore, GaN-based bipolar transistors can have high emitter/base recombination current compared to silicon (Si)-based bipolar transistors, which is likely due to poor passivation. GaN-based bipolar transistors also often do not employ integration of Junction Termination Extension (JTE) structure for reliable high-voltage operation.

Techniques provided herein can help mitigate and/or eliminate some or all of these issues arising when GaN-based bipolar transistors are used in high-power and/or high-temperature operations. For example, some embodiments herein provide for the use of an InGaN base structure to increase ionization and decrease base resistance, and/or a regrown InGaN contact to reduce contact resistivity. Moreover the use of one or more spacer(s) can minimize base-contact-to-emitter distance to combat high sheet resistance of the base layer. Spacer(s) and/or a passivation layer also can provide electrical isolation between emitter and base contacts to reduce emitter/base recombination current. Additionally or alternatively, embodiments can provide for JTE integration to enhance high-voltage operation.

Figure 1:
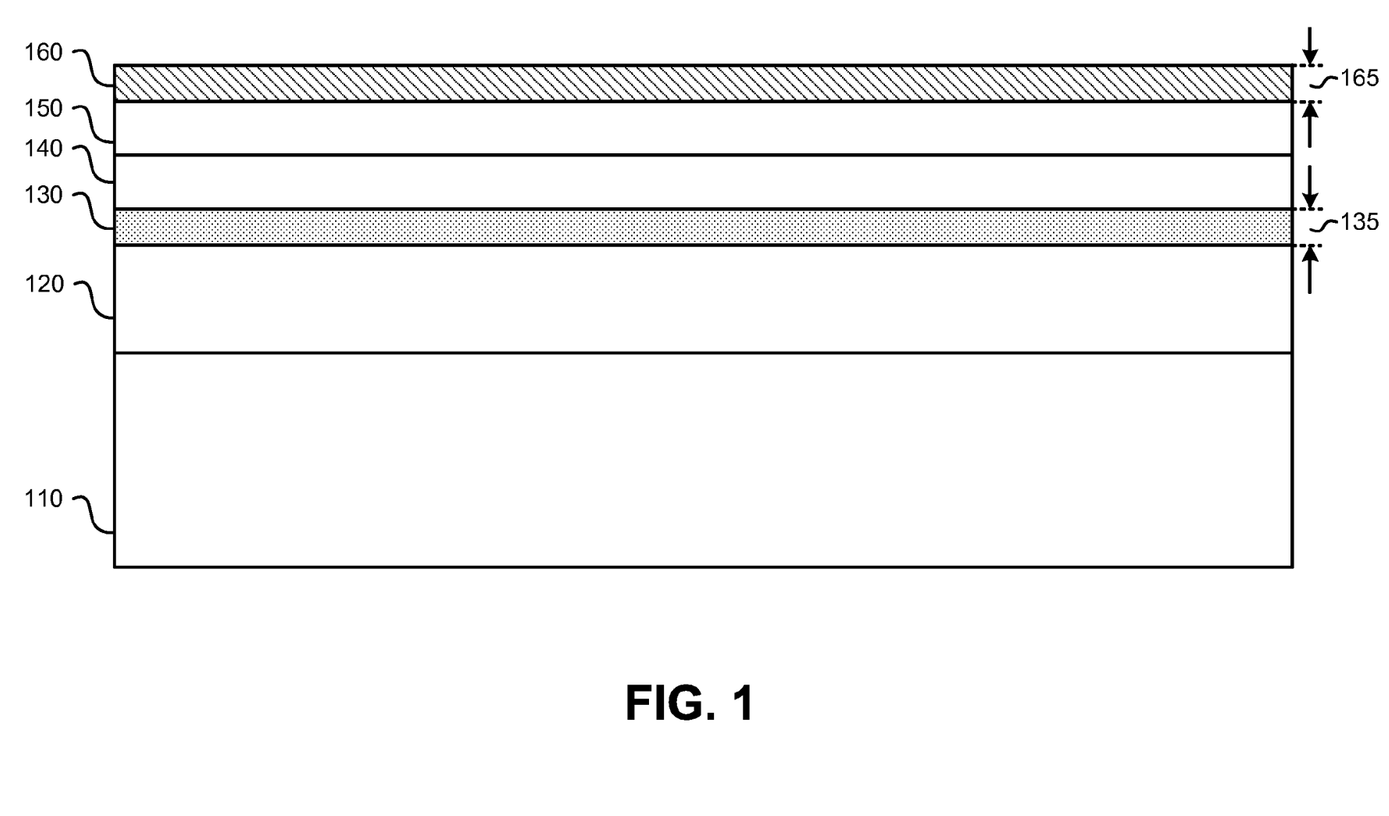
FIGS. 1-12 are simplified cross-sectional diagrams illustrating the fabrication of a vertical bipolar transistor according to an embodiment of the present invention.

FIGS. 1-12 are simplified cross-sectional diagrams illustrating a process for creating a vertical bipolar transistor, according to one embodiment. Referring to FIG. 1, a first GaN epitaxial layer 120 is formed on a GaN substrate 110. As indicated above, the GaN substrate 110 can be a pseudo-bulk GaN material on which the first GaN epitaxial layer 120 is grown. The GaN substrate 110 can serve as a collector for the vertical bipolar transistor. Dopant concentrations (e.g., doping density) of the GaN substrate 110 can vary. For example, a GaN substrate 110 can have an n+ conductivity type, with dopant concentrations ranging from $1\times10^{17}$ cm$^{-3}$ to $1\times10^{19}$ cm$^{-3}$. Although the GaN substrate 110 is illustrated as including a single material composition, multiple layers can be provided as part of the substrate. Moreover, adhesion, buffer, and other layers (not illustrated) can be utilized during the epitaxial growth process. One of ordinary skill in the art would recognize many variations, modifications, and alternatives.

The properties of the first GaN epitaxial layer 120 can also vary, depending on desired functionality. The first GaN epitaxial layer 120 can serve as a drift region for the vertical bipolar transistor, and therefore can be a relatively low-doped material. In some embodiments, the dopant concentration of the first GaN epitaxial layer 120 is lower than the dopant concentration of the GaN substrate 110. For example, the first GaN epitaxial layer 120 can have an n-conductivity type, with dopant concentrations between about $1\times10^{14}$ cm$^{-3}$ to $1\times10^{18}$ cm$^{-3}$. Furthermore, the dopant concentration can be uniform, or can vary, for example, as a function of the thickness of the drift region. In some embodiments, the first GaN epitaxial layer 120 can comprise two or more sublayers, which can have differing physical characteristics (e.g., dopant concentrations, dopant uniformity, etc.)

The thickness of the first GaN epitaxial layer 120 can also vary substantially, depending on the desired functionality. As discussed above, homoepitaxial growth can enable the first GaN epitaxial layer 120 to be grown far thicker than layers formed using conventional methods. For example, in some embodiments, thicknesses can vary between 0.5 μm to 100 μm or more.

Different dopants can be used to create n- and p-type GaN epitaxial layers and structures disclosed herein. For example, n-type dopants can include silicon, germanium, oxygen, or the like. P-type dopants can include magnesium, beryllium, zinc, or the like.

A base layer 130 or other base structure can be coupled to the first GaN epitaxial layer 120. Embodiments may utilize a relatively highly doped base layer 130 to decrease lateral resistance of the vertical bipolar transistor. High doping, however, can adversely affect electron transport through the base structure by reducing carrier lifetime. Depending on desired functionality, embodiments may weigh this tradeoff differently. Lower doping can also make it difficult to achieve an Ohmic contact on the base region. However, as provided in more detail below, embodiments can include regrown base layer contacts to help provide acceptable Ohmic contacts.

Embodiments may include base layer 130 of GaN, InGaN, and/or other suitable materials. For embodiments in which the base layer 130 has p-type conductivity, Mg may be used as a dopant. InGaN has a lower band gap relative to GaN, so the use of InGaN may help increase ionization of Mg dopants. The lower resistance of InGaN, relative to other materials that may be used in GaN-based bipolar transistors, can provide for better utilization of the emitter. In particular, a low-resistance base material can reduce the current-crowding effect near the edge of the emitter by providing for increased recombination in the center of the emitter.

The physical characteristics of the base layer 130 can vary, depending on desired functionality. For example, in some embodiments, the thickness 135 of the base layer 130 can be between 100 nm and 300 nm. In other embodiments, the thickness 135 of the base layer 130 can be anywhere between 50 nm to 1,000 nm. The base layer's dopant concentration can be between $1 \times 10^{18}$ cm$^{-3}$ and $1 \times 10^{19}$. In other embodiments, the dopant concentration of the base layer 130 can be anywhere between $5 \times 10^{17}$ cm$^3$ and $3 \times 10^{19}$ cm$^3$. Yet other embodiments may include thicknesses and/or dopant concentrations outside these ranges.

One method of forming the base layer 130, and other layers described herein, can be through a regrowth process that uses an in-situ etch and diffusion preparation processes. These preparation processes are described in U.S. patent application Ser. No. 13/198,666, filed Aug. 4, 2011, entitled "METHOD AND SYSTEM FOR FORMATION OF P-N JUNCTIONS IN GALLIUM NITRIDE BASED ELECTRONICS," the entirety of which is hereby incorporated by reference.

An emitter structure of the bipolar transistor can be formed from at least one layer of GaN and/or another III-nitride material. In the embodiments shown in FIG. 1, two emitter layers 140 and 150 are provided. In one embodiment, the first layer 140 and the second layer 150 are n-type layers, the second layer 150 having a higher dopant concentration then the first layer 140. Either or both emitter layers 140 and 150 can comprise GaN, aluminum gallium nitride (AlGaN), indium gallium nitride (InGaN) and/or other suitable materials.

Embodiments can also include a first dielectric layer 160, such as aluminum nitride (AlN). For reasons shown herein below, type of first dielectric layer may be chosen to help facilitate regrowth of GaN and/or other III-nitride materials in the manufacture of the vertical bipolar transistor. Depending on desired functionality, the thickness 165 of the first dielectric layer 160 can vary, depending on desired emitter passivation, manufacturing concerns, and/or other factors.

Figure 2:
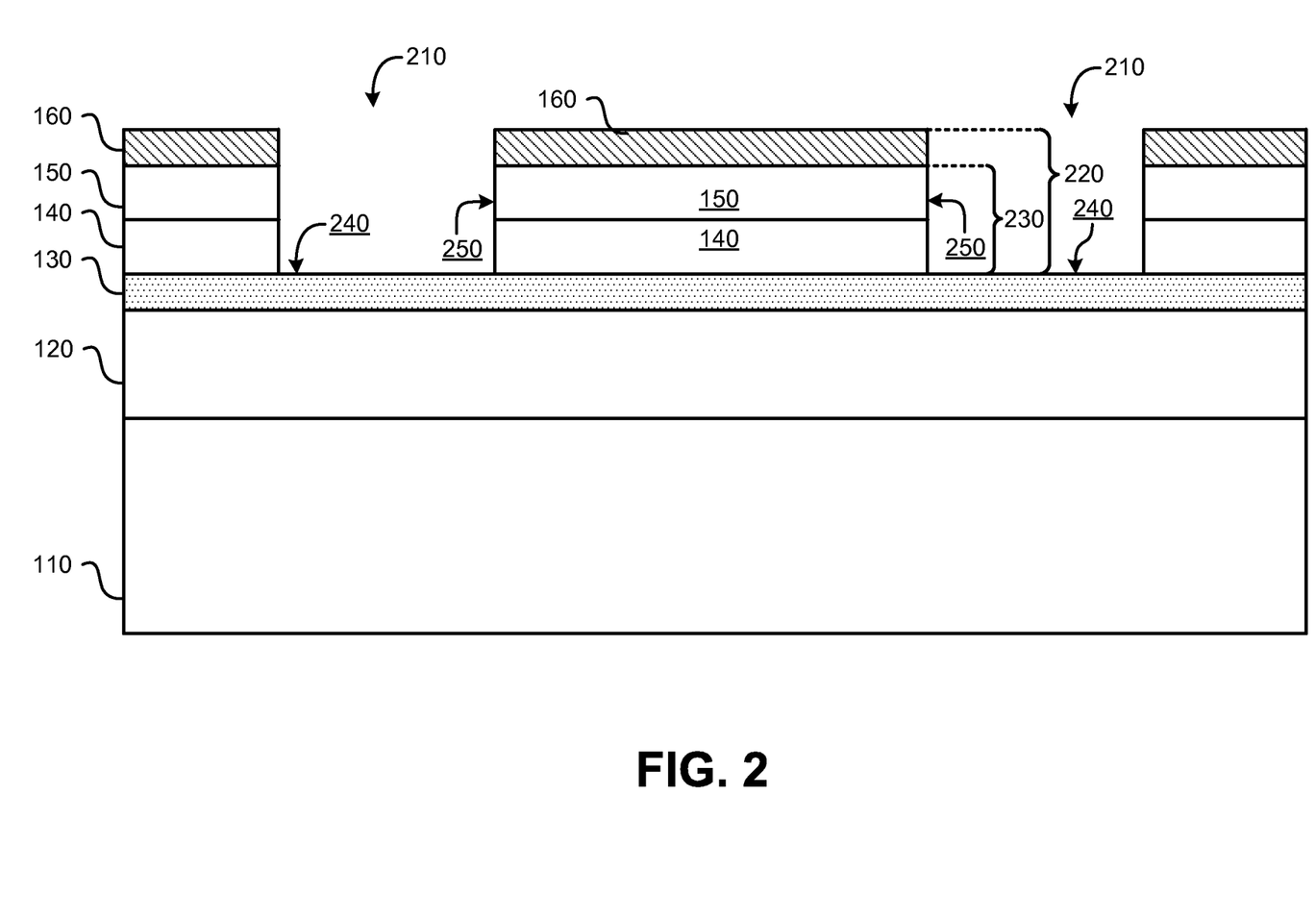

Referring to FIG. 2, one or more portions of the first dielectric layer 160 and the two emitter layers 140 and 150 can be removed to expose at least a portion of a surface 240 of the base layer 130. The removed portion(s) can form one or more wells 210 adjacent to a layered structure 220 having one or more sidewall(s) 250. The layered structure 220 can comprise and emitter structure 230 formed from the two emitter layers 140 and 150, with the first dielectric layer 160 coupled thereto. Removal of the portion(s) of the first dielectric layer 160 and the two emitter layers 140 and 150 can involve one or more etching processes, such as a dry etch that may be followed by a wet and/or photoelectric-enhanced wet etch to help restore some of the damage that may have been caused by the dry etch.

Figure 3:
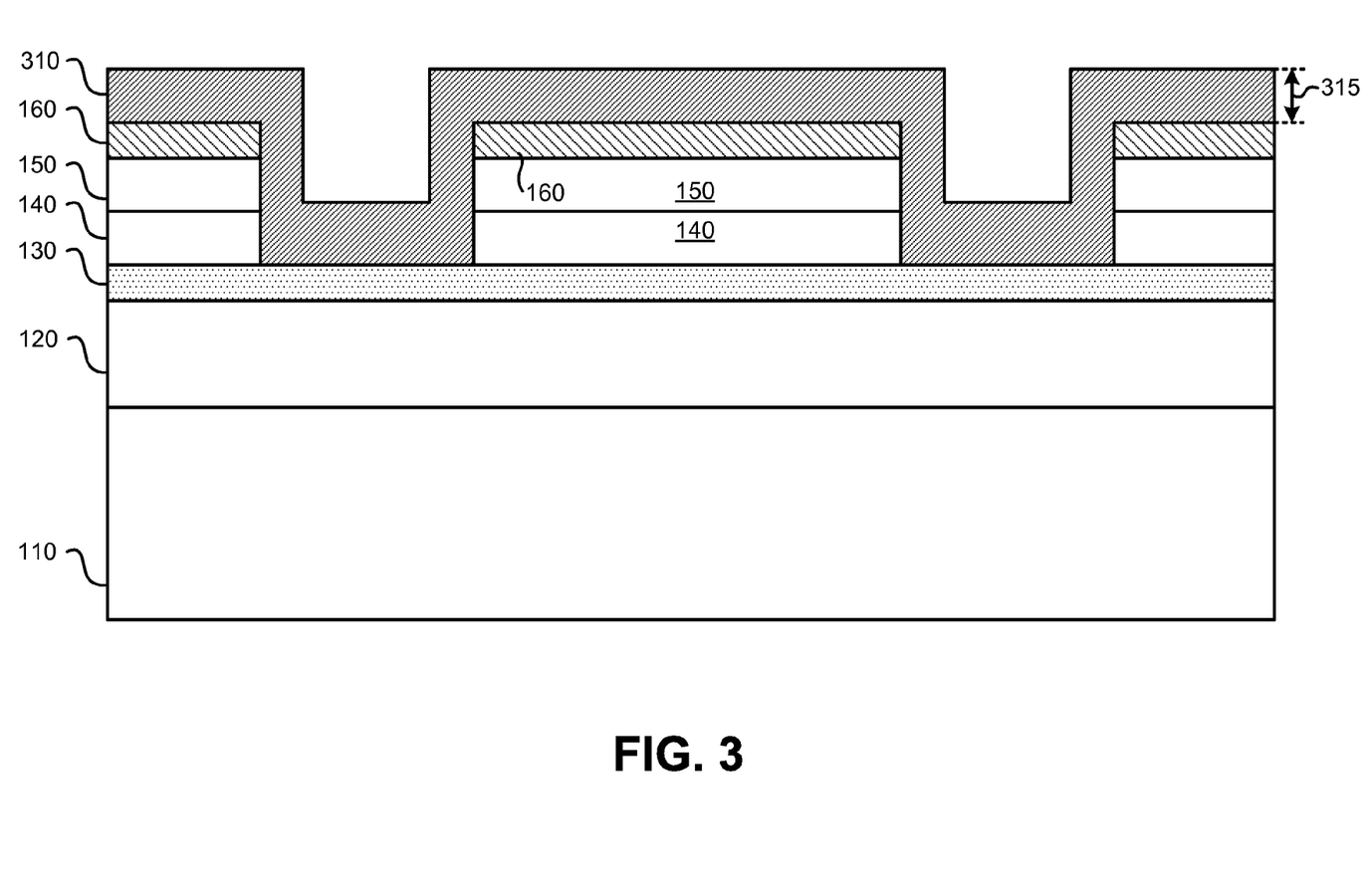
Figure 4:
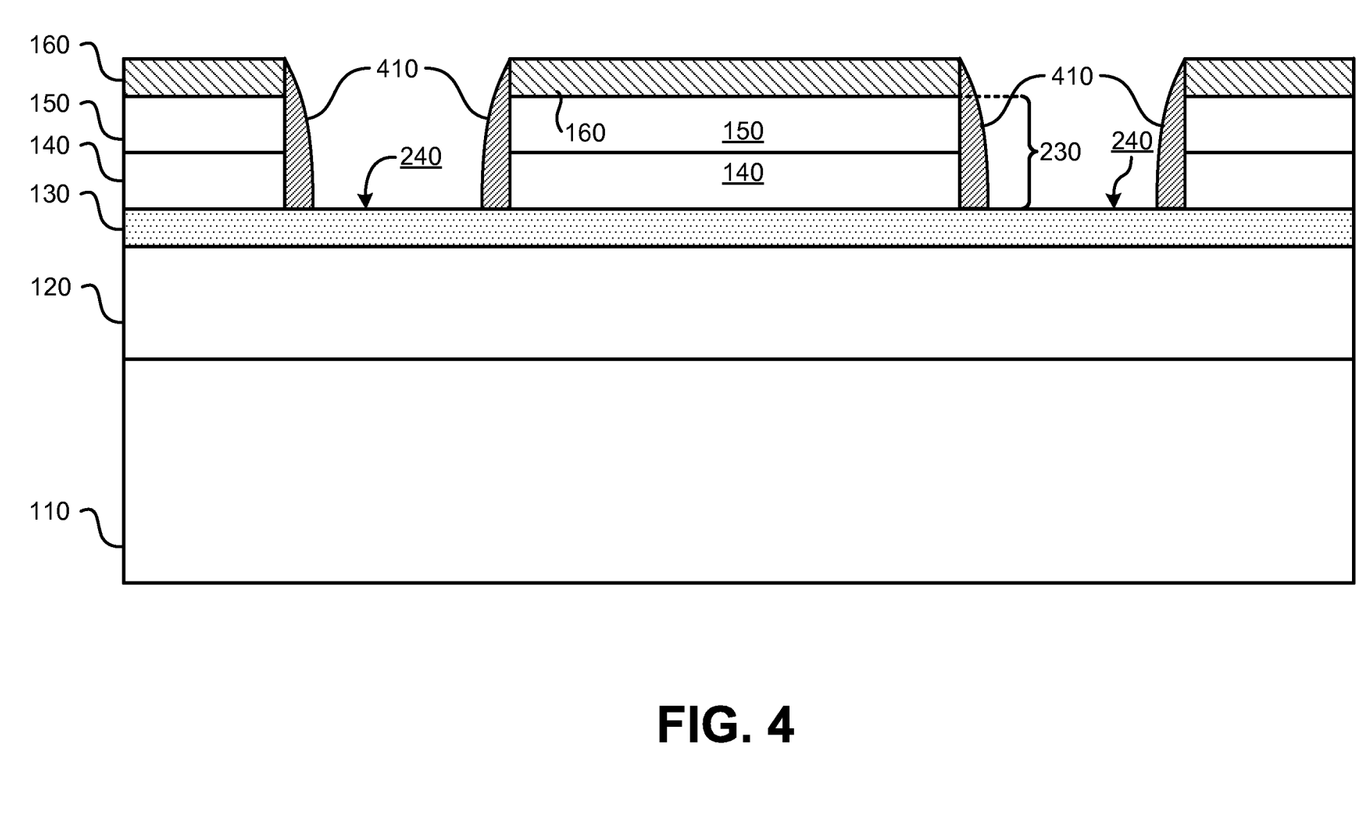

FIGS. 3 and 4 show how a second dielectric layer 310 can be deposited and/or otherwise formed, then removed (e.g., etched) to create spacers 410 that are coupled to the sidewalls 250 of the layered structure 220. The second dielectric layer 310 can comprise a dielectric material such as AlN, silicon nitride (SiN), silicon dioxide (SiO$_2$), silicon oxynitride (SiO$_y$Nx) and/or other suitable materials. In some embodiments, the dielectric material(s) used in the second dielectric layer 310 can be chosen to withstand temperatures used in one or more subsequent regrowth processes.

As illustrated in FIG. 3, the second dielectric layer 310 can be a conformal layer. The thickness 315 of the second dielectric layer 310 can be chosen based on desired spacer size and/or other concerns. For example, some embodiments may have a thickness 315 of the second dielectric layer 310 of approximately 100 nm. Other embodiments may include a thickness 315 greater than or less than 100 nm. In some embodiments, the second dielectric layer 310 can comprise a plurality of materials and/or include a stack of two or more sublayers. A person of ordinary skill in the art will recognize many alterations, substitutions, and variations.

The spacers 410 of FIG. 4 can be formed by removing at least a portion of the second dielectric layer 310. This removal process, in some embodiments, can include a dry etch, such as a Reactive-Ion Etching (RIE), that is selective to the second dielectric layer 310. That is, this etching step may have a much higher etch rate for the second dielectric layer 310 than for the base layer 130 and/or the first dielectric layer 160. The formation and anisotropic (substantially vertical) etching of second dielectric layer 310 can therefore result in a self-aligned process that creates one or more spacers 410 along the sidewalls of the two emitter layers 140 and 150. Here, too, the dry etch may be followed by a wet and/or photoelectric-enhanced wet etch to help restore some of the damage that may have been caused by the dry etch. This may help provide a suitable surface for a subsequent regrowth process.

Because the spacers 410 also can overlap with the first dielectric layer 160 coupled to the emitter structure 230 formed by the two emitter layers 140 and 150, the formation of the spacers 410 can provide complete passivation of the emitter structure 230. Among other advantages, this can provide electrical isolation between the emitter structure 230 and subsequently-formed base contacts formed on exposed surface(s) 240 of the base layer 130.

Figure 5:
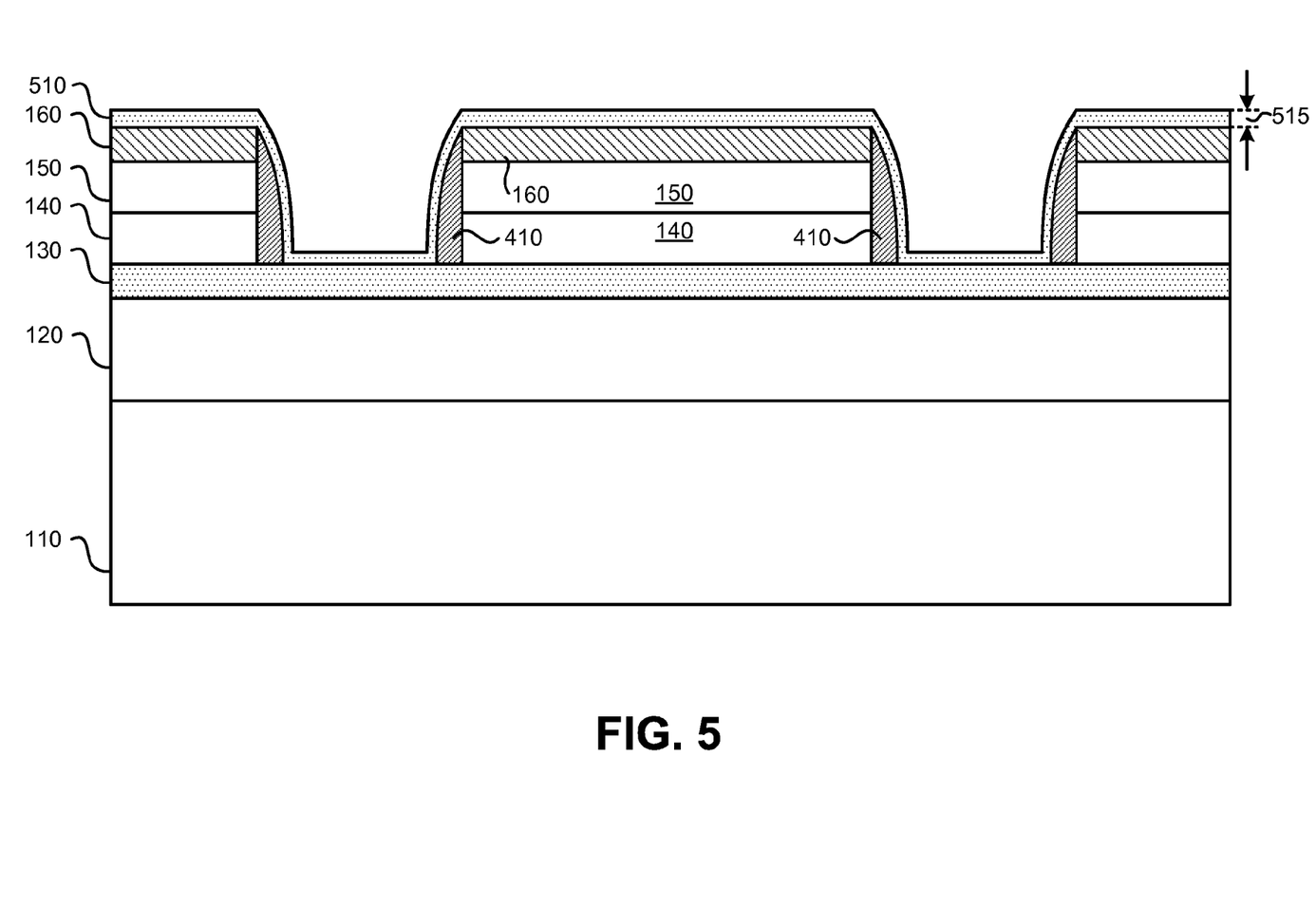

FIG. 5 is a simplified cross-sectional diagram illustrating the formation of a first base contact layer 510 coupled to the base layer 130, spacers 410, and first dielectric layer 160. The first base contact layer 510 can have the same electrical conductivity type as the base layer and can be formed, for example, using an epitaxial regrowth process to help form a good Ohmic contact with the base layer 130. In one embodiment, the first base contact layer 510 can comprise InGaN. Other embodiments may include one or more superlattice contacts, including ternaries and quaternaries such as InGaN, aluminum indium gallium nitride (AlInGaN), or the like.

The physical properties of the first base contact layer 510 can vary depending on desired functionality. Embodiments can have the first base contact layer 510 with a thickness 515 of can be between 5 nm and 50 nm. In some embodiments, for example, the first base contact layer 510 can have a thickness between 5 nm and 10 nm. Other embodiments may include a thickness 515 outside these ranges. Although FIG. 5 shows the first base contact layer 510 as a conformal, nonselective layer, this may vary depending on manufacturing concerns. In some embodiments, for example, growth can be selective. In other words, first base contact layer 510 may not grow on the dielectric masks. Furthermore, first base contact layer 510 may not conformal as shown in FIG. 5.

The first base contact layer 510 also can be formed using low-temperature regrowth. Such low-temperature regrowth can help insure indium incorporation in the formation of an InGaN layer. In some embodiments, the temperature can be between 600° C. and 800° C. For example, some embodiments use regrowth temperatures of approximately 650° C. However, depending on the composition of the first base contact layer 510, manufacturing concerns, and/or other factors, embodiments may use temperatures higher than 800° C. or lower than 600° C.

Figure 6:
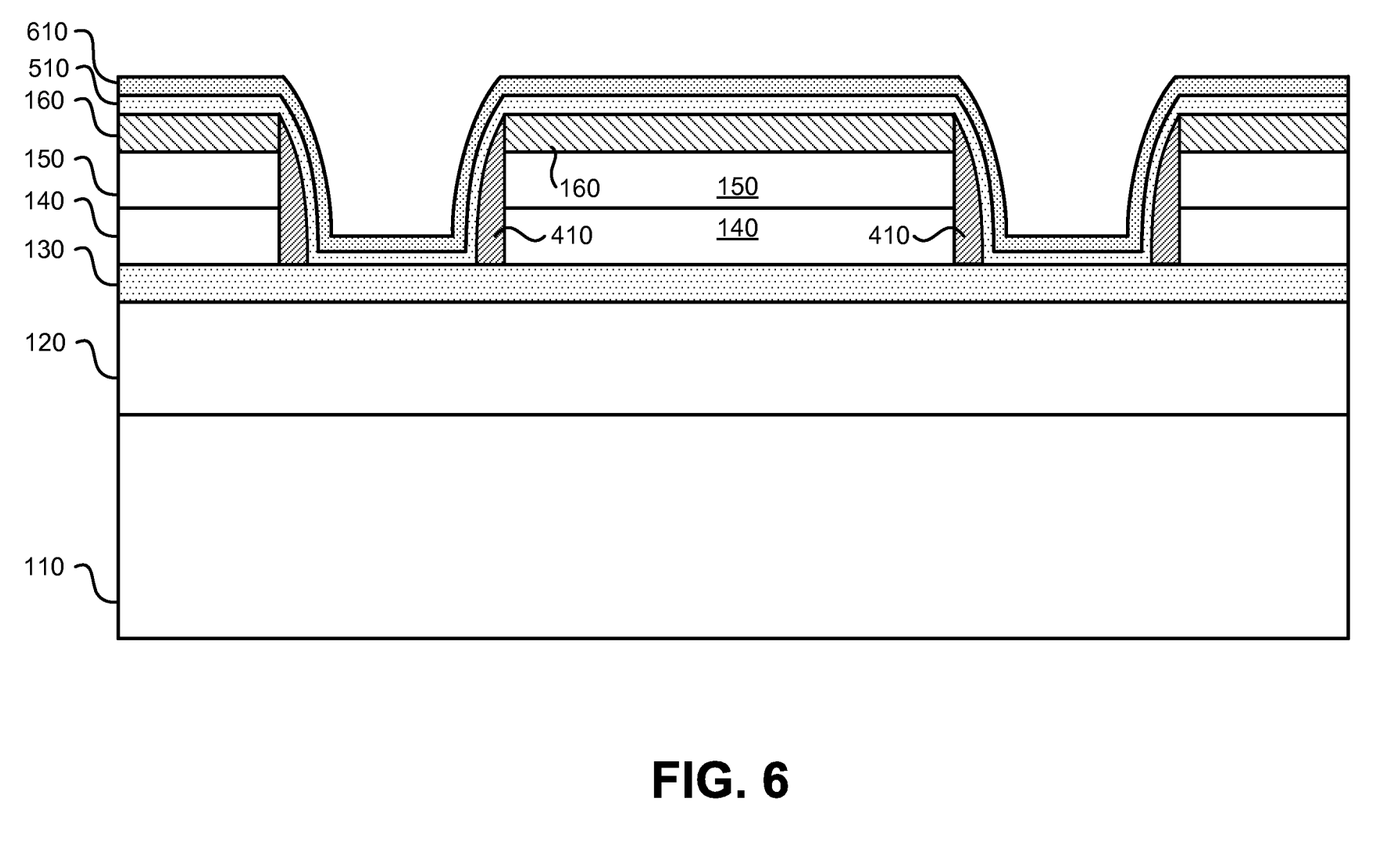

FIG. 6 illustrates the formation of a second base contact layer 610 coupled with the first base contact layer 510. The second base contact layer 610 can comprise, for example, a metal layer coupled with the first base contact layer 510 to form an Ohmic contact. The metal layer may include various sublayers. In some embodiments, for example, the second base contact layer 610 and/or a metal sublayer coupled with the first base contact layer 510, can include platinum, paladium, nickel, or similar ohmic metal. The second base contact layer 610 can include sublayers with other metals and/or alloys including, but not limited to, aluminum, titanium, nickel, gold, combinations thereof, or the like The second base contact layer 610 can be formed using any of a variety of methods such as sputtering, lift-off, evaporation, or the like.

Figure 7:
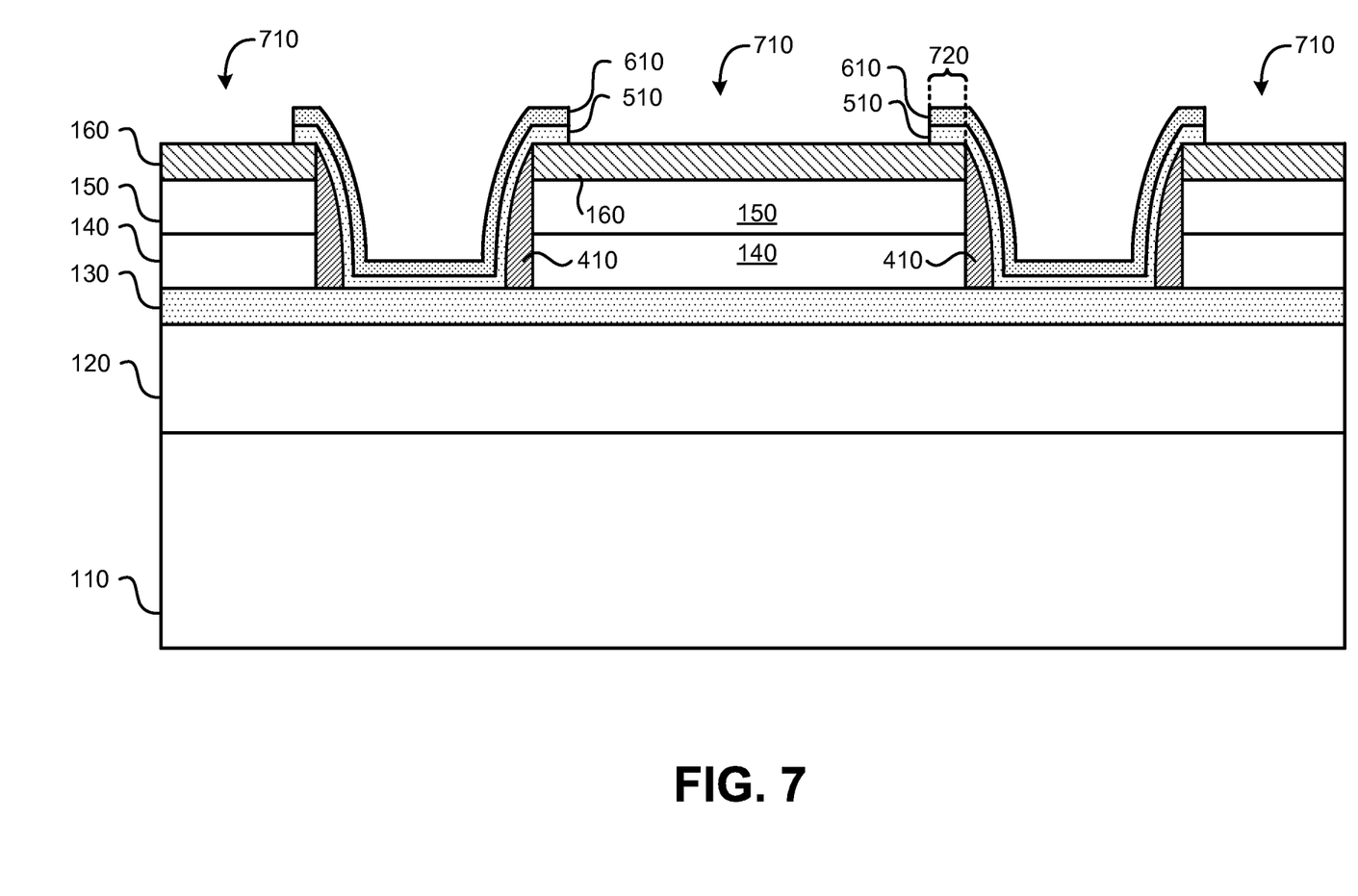

FIG. 7 shows how at least a portion 710 of the first and second base contact layers 510 and 610 can be removed to form the base contacts from remaining portions of the first and second base contact layers 510 and 610. Here, unlike other bipolar transistor processes, complete passivation of the emitter structure 230 (formed from the two emitter layers 140 and 150) can be provided by the spacers 410 and the first dielectric layer 160. There can therefore be an overlap 720 between the base contact and the emitter structure 230.

This process can therefore facilitate the formation of a base contact. Traditional processes can require high photolithographic precision to provide a gap between a base contact and an emitter to electrically isolate the base and emitter while attempting to keep resistance between the two at a minimum. Because the techniques provided herein allow for an overlap 720 between the base contact and the emitter structure 230, such photolithographic precision is not required. Furthermore, the formation of spacers and the user of regrowth provide for self-aligned base contacts that maximize contact with the base layer 130, reducing the resistance of the contact. Moreover, the passivation of the emitter structure 230 as provided herein may obviate the need to perform certain subsequent passivation steps.

Figure 8:
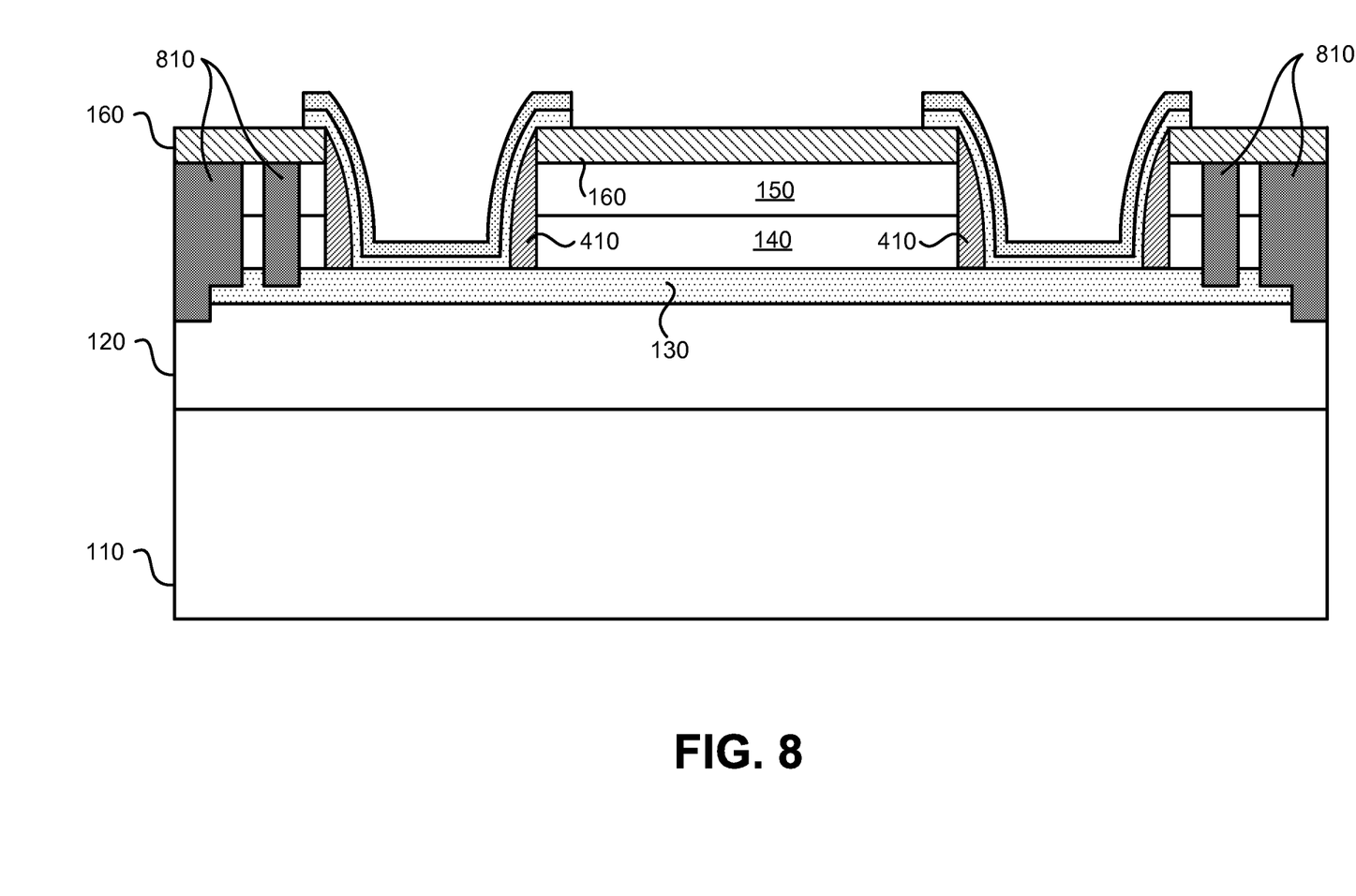

FIG. 8 illustrates an optional formation of one or more junction termination elements 810, or edge termination structures. Some or all of the junction termination elements 810 can be utilized in fabricating a junction termination structure, such as a guard ring that circumscribes the bipolar transistor. The junction termination elements 810 can be formed by ion implantation of through the first dielectric layer 160 to reduce the conductivity of the first emitter layer 140, second emitter layer 150, base layer 130, and/or first GaN epitaxial layer 120. These ion implantation processes can be performed through mask openings formed in a layer of photoresist, silicon dioxide, or other suitable masking materials (not shown). They can further use argon, nitrogen, helium, hydrogen or other appropriate species to form the junction termination elements 810 by reducing the conductivity of existing layers.

The physical properties of the junction termination elements 810 and the techniques used to form them can vary. These properties and techniques are described in U.S. patent application Ser. No. 13/334,742, filed Dec. 22, 2011, entitled "METHOD AND SYSTEM FOR JUNCTION TERMINATION IN GAN MATERIALS USING CONDUCTIVITY MODULATION," the entirety of which is hereby incorporated by reference.

Figure 9:
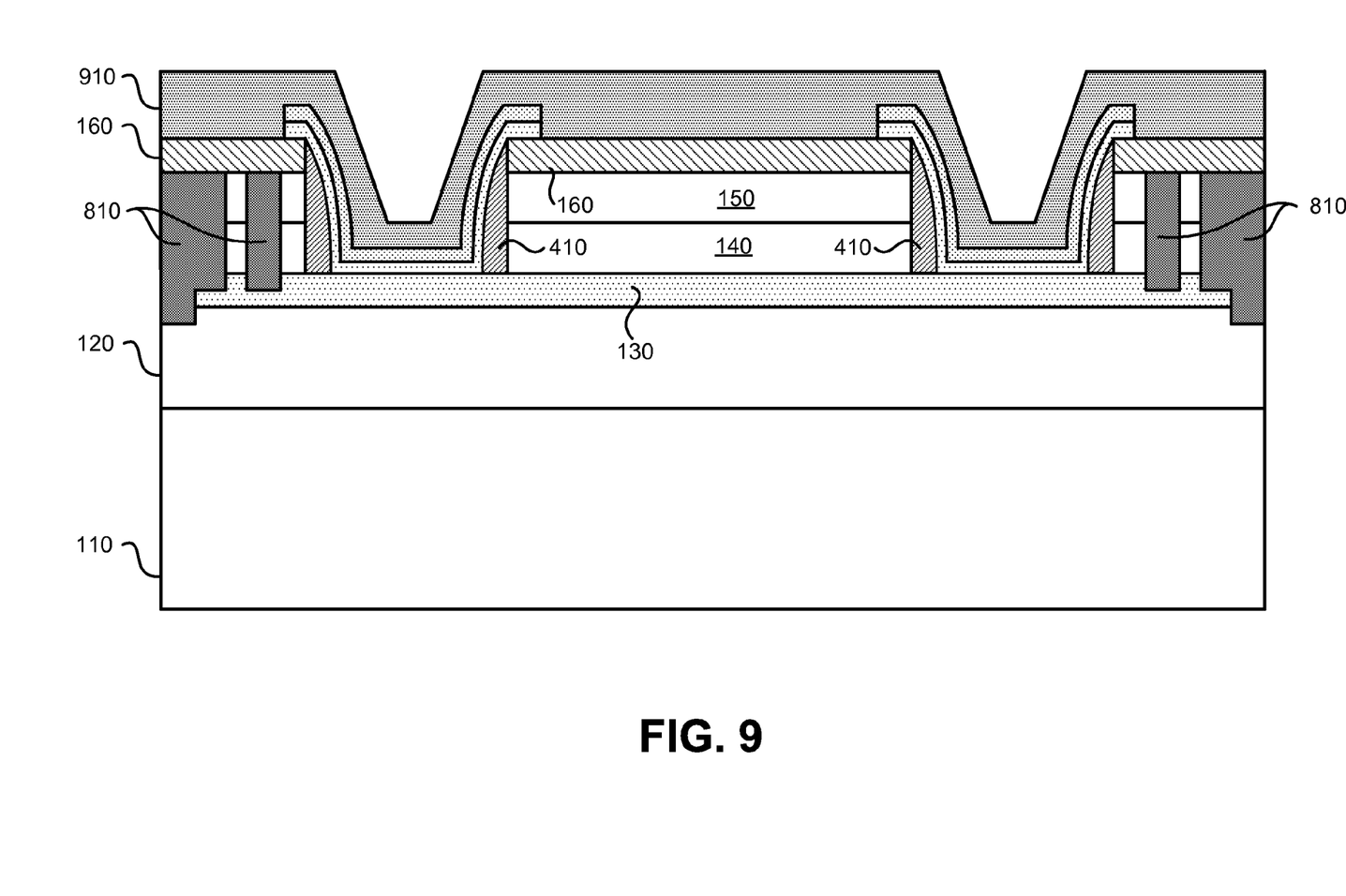
Figure 10:
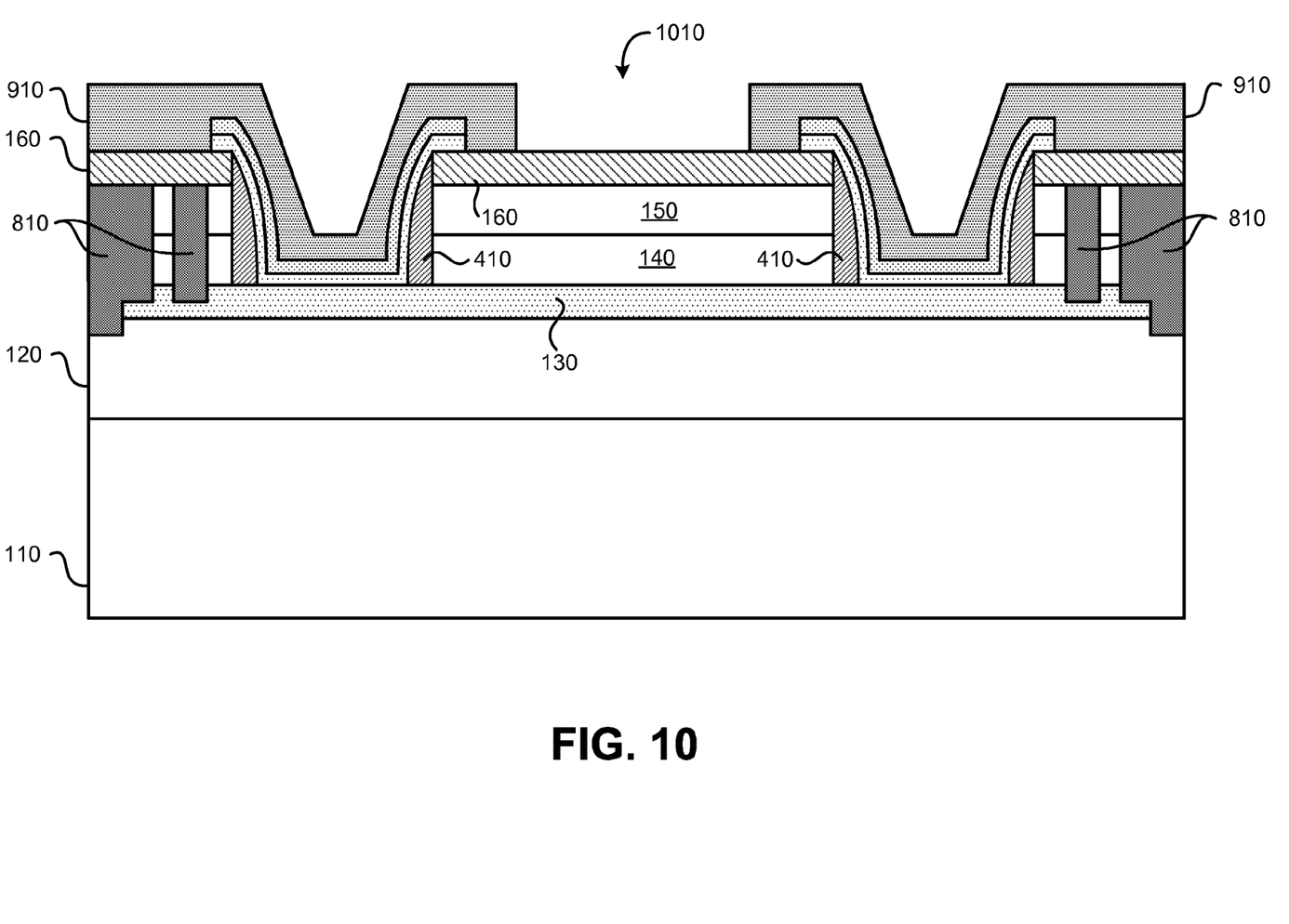
Figure 11:
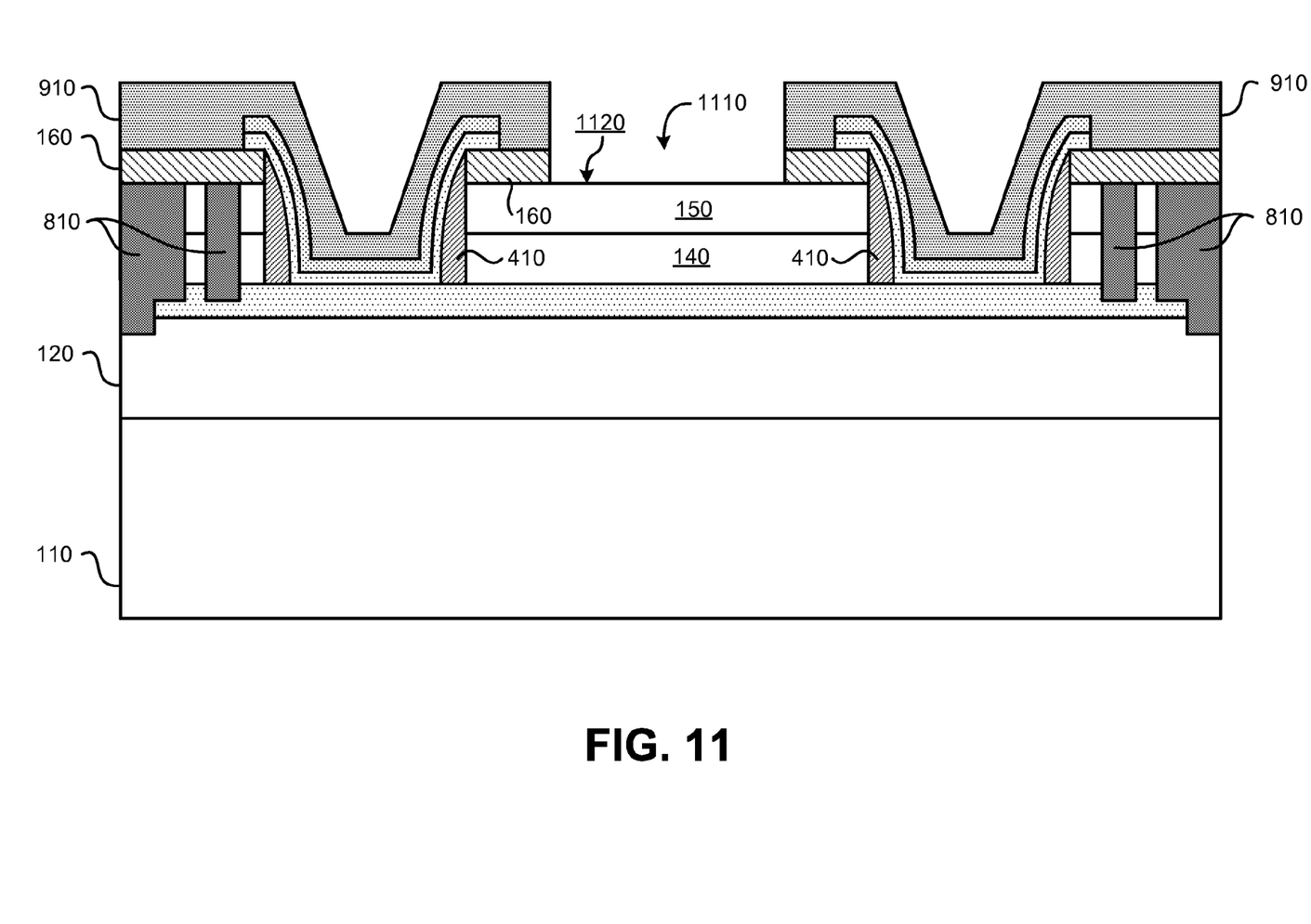

FIGS. 9-11 illustrate the formation of a third dielectric layer 910 and the formation of openings 1010 and 1110 to the emitter structure 230. Similar to other dielectric layers described herein, the third dielectric layer 910 can comprise a dielectric material such as AN, SiN, SiO2, and/or other suitable materials for providing passivation. The formation of the openings 1010 and 1110 to the emitter structure 230 can be performed by one or more etch processes. Moreover, depending on manufacturing concerns and/or other factors, the same etch mask used to etch the opening 1010 in the third dielectric layer 910 may be used to etch the opening 1110 in the first dielectric layer 160, thereby providing a self-aligned process to expose a top surface 1120 of the emitter structure 230.

Figure 12:
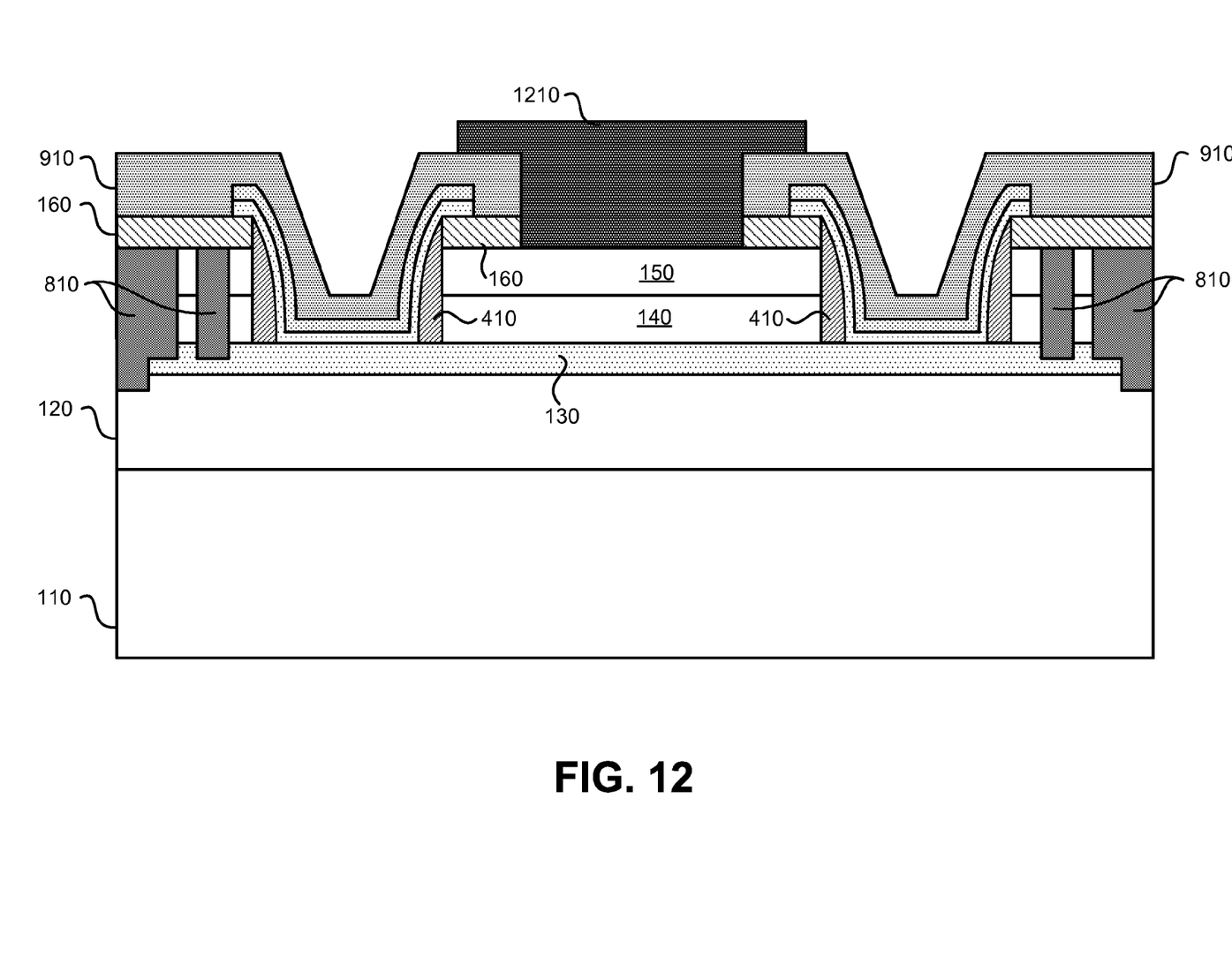

FIG. 12 illustrates the formation of an emitter contact by forming a metal structure 1210 coupled to the emitter structure 230 via the openings 1010 and 1110. The metal structure 1210 can provide an Ohmic contact with the second emitter layer 150 and can include any of a variety of metals including platinum, paladium, aluminum, titanium, nickel, gold, combinations thereof, or the like. The metal structure 1210 can be formed using any of a variety of methods such as sputtering, lift-off, evaporation, or the like.

The process shown in FIGS. 1-12 are provided as an example only, and are not limiting. Furthermore, the figures are not drawn to scale, and the manufacture of the vertical bipolar transistor can include additional steps and/or features that are not shown. For example, an ohmic metal contact may be created on the bottom of GaN substrate 110 to serve as the collector electrode of the vertical bipolar transistor. The layers and/or structures described herein may include a number of sublayers, substructures, and/or other components to provide the functionality described herein. One of ordinary skill in the art would recognize many variations, modifications, and alternatives.

Although some embodiments described herein, including the process shown in FIGS. 1-12, are discussed in terms of GaN substrates and GaN and/or InGaN epitaxial layers, the present invention is not limited to these particular III-V materials and is applicable to a broader class of III-V materials, in particular III-nitride materials. Additionally, although a GaN substrate is illustrated in FIG. 1, embodiments of the present invention are not limited to GaN substrates. Other III-V materials, in particular, III-nitride materials, are included within the scope of the present invention and can be substituted not only for the illustrated GaN substrate, but also for other GaN-based layers and structures described herein. As examples, binary III-V (e.g., III-nitride) materials, ternary III-V (e.g., III-nitride) materials such as InGaN and AlGaN, quaternary III-nitride materials, such as AlInGaN, doped versions of these materials, and the like are included within the scope of the present invention.

Figure 13:
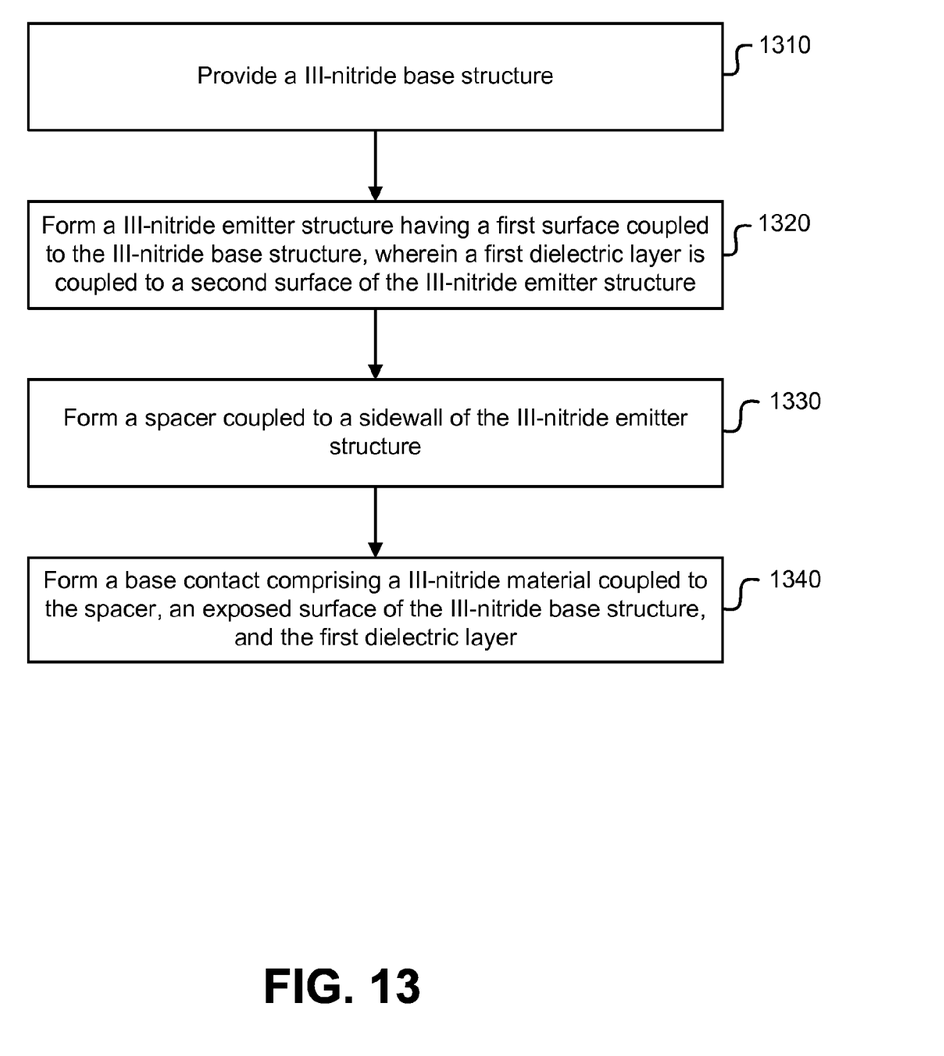
FIG. 13 is a simplified flowchart illustrating a method of fabricating a vertical bipolar transistor, according to another embodiment of the present invention.

FIG. 13 is simplified flowchart illustrating a method of fabricating a vertical bipolar transistor, according to an embodiment of the present invention. The method can include providing a III-nitride base structure (1310). The III-nitride base structure can have a first conductivity type, and/or may be formed using epitaxial regrowth. In an embodiment, the III-nitride base structure is a p-type InGaN structure. The III-nitride base structure may be formed on a drift layer and substrate, such as the first GaN epitaxial layer 120 and GaN substrate 110, respectively, of FIG. 1.

The method further includes forming a III-nitride emitter structure having a first surface coupled to the III-nitride base structure, wherein a first dielectric layer coupled to a second surface of the III-nitride emitter structure (1320). As discussed previously, the emitter structure can comprise one or more emitter layers, depending on desired functionality. In an embodiment, the one or more emitter layers comprise n-type GaN epitaxial layers coupled to a p-type III-nitride base structure. In some embodiments, a passivation layer is formed on these emitter layers and the passivation and emitter layers are etched to form the III-nitride emitter structure, capped with a passivation layer. The III-nitride emitter structure (and passivation layer) can have a sidewall adjacent to an exposed portion of a surface of the III-nitride base structure.

Where the III-nitride emitter structure comprises at least two III-nitride epitaxial layers, and a first III-nitride epitaxial layer, coupled to a surface of the III-nitride base structure, can have a first dopant concentration. A second III-nitride epitaxial layer coupled to the first III-nitride epitaxial layer, can have a second dopant concentration greater than the first dopant concentration. In an embodiment, for example, the first III-nitride layer can be an n-type GaN layer, and a second III-nitride layer can be an n+-type GaN layer.

A spacer is coupled to a sidewall of the III-nitride emitter structure (1330). As described previously, the spacer can be made by depositing a passivation layer and removing at least a portion of the passivation layer to form the spacer. The spacer, together with the first dielectric layer, can form passivation around the emitter structure.

The process further includes forming a base contact comprising a III-nitride material coupled to the spacer, an exposed surface of the III-nitride base structure, and the first dielectric layer (1340). The III-nitride material can be formed using epitaxial regrowth. In an embodiment, the III-nitride material comprises p-type InGaN coupled to a p-type InGaN base structure. As discussed herein, the base contact can also comprise one or more metal layers coupled to the III-nitride material.

As discussed previously, additional processes can be included. For example, a second dielectric layer can be formed, coupled the base contact structure and the first dielectric layer. At least a portion of the second dielectric layer and the first dielectric layer can be removed (e.g., etched) to expose a portion of the second surface of the III-nitride emitter structure, and a metal structure (e.g., pad metal) can be couple to the exposed portion of the second surface of the III-nitride emitter structure. Moreover, as discussed previously, the same etch mask may be used to remove portions of both the first and second dielectric layers.

It should be appreciated that the specific steps illustrated in FIG. 13 provide a particular method of fabricating a vertical bipolar transistor according to an embodiment of the present invention. Other sequences of steps may also be performed according to alternative embodiments. For example, alternative embodiments of the present invention may perform the steps outlined above in a different order. Moreover, the individual steps illustrated in FIG. 13 may include multiple substeps that may be performed in various sequences as appropriate to the individual step. Furthermore, additional steps may be added or removed depending on the particular applications. For example, some embodiments may provide for forming one or more edge termination structures (i.e., edge termination elements) by, for example, implanting ions into one or more III-nitride structures One of ordinary skill in the art would recognize many variations, modifications, and alternatives.

Bipolar transistors can be provided in any of a variety of shapes and forms, depending on desired functionality and type (e.g., BJT, HBT, etc.). Additionally or alternatively, conductivity types of the examples provided herein can be reversed (e.g., replacing an n-type semiconductor material with a p-type material, and vice versa), depending on desired functionality. Moreover, embodiments provided herein using GaN can use other III-nitride materials in addition or as an alternative to GaN. Other variations, alterations, modifications, and substitutions are contemplated.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating a vertical bipolar transistor, the method comprising:
   providing a III-nitride base structure of a first conductivity type;
   forming a III-nitride emitter structure of a second conductivity type having a first surface and a second surface, the second surface being substantially opposite the first surface, wherein:
      the first surface of the III-nitride emitter structure is coupled to a surface of the III-nitride base structure;
      a first dielectric layer is coupled to the second surface of the III-nitride emitter structure; and
      the III-nitride emitter structure has a sidewall adjacent to an exposed portion of the surface of the III-nitride base structure;
   forming a spacer coupled to the sidewall of the III-nitride emitter structure and the exposed portion of the surface of the III-nitride base structure; and
   forming a base contact structure comprising a III-nitride material coupled to the spacer, the exposed portion of the surface of the III-nitride base structure, and the first dielectric layer, such that the first dielectric layer and the spacer are disposed between the base contact structure and the III-nitride emitter structure.

2. The method of claim 1 further comprising:
   forming a second dielectric layer coupled to the base contact structure and the first dielectric layer;
   removing at least a portion of the second dielectric layer and the first dielectric layer to expose a portion of the second surface of the III-nitride emitter structure; and
   forming a metal structure coupled to the exposed portion of the second surface of the III-nitride emitter structure.

3. The method of claim 2 wherein:
   removing at least a portion of the second dielectric layer and the first dielectric layer is performed by etching; and
   an etch mask used in the removing the at least a portion of the second dielectric layer is also used in the removing the at least a portion of the first dielectric layer.

4. The method of claim 1 further comprising forming the III-nitride material of the base contact structure using epitaxial regrowth.

5. The method of claim 1 further comprising forming one or more edge termination structures.

6. The method of claim 5 wherein forming the one or more edge termination structures comprises implanting ions into one or more III-nitride structures.

7. The method of claim 1 wherein the III-nitride base structure comprises indium gallium nitride (InGaN).

8. The method of claim 1 wherein the III-nitride emitter structure comprises at least two III-nitride epitaxial layers, and forming the III-nitride emitter structure comprises:
   forming a first III-nitride epitaxial layer coupled to the surface of the III-nitride base structure, the first III-nitride epitaxial layer having a first dopant concentration; and
   forming a second III-nitride epitaxial layer coupled to the first III-nitride epitaxial layer, the second III-nitride epitaxial layer having a second dopant concentration;
   wherein the first dopant concentration is less than the second dopant concentration.

9. The method of claim 1 wherein forming the base contact structure comprises forming a metal layer coupled to the III-nitride material of the base contact structure.

10. A semiconductor device comprising:
    a III-nitride base structure of a first conductivity type;
    a III-nitride emitter structure of a second conductivity type having a first surface and a second surface, the second surface being substantially opposite the first surface, wherein the first surface of the III-nitride emitter structure is coupled to a surface of the III-nitride base structure;
    a first dielectric layer coupled to the second surface of the III-nitride emitter structure;
    a spacer coupled to a sidewall of the III-nitride emitter structure and the surface of the III-nitride base structure; and
    a base contact structure comprising a III-nitride material coupled to the spacer, the surface of the III-nitride base structure, and the first dielectric layer, such that the first dielectric layer and the spacer are disposed between the base contact structure and the III-nitride emitter structure.

11. The semiconductor device of claim 10 further comprising:
    a second dielectric layer coupled to the base contact structure and the first dielectric layer; and
    a metal structure coupled to of the second surface of the III-nitride emitter structure.

12. The semiconductor device of claim 10 further comprising one or more edge termination structures.

13. The semiconductor device of claim 12 wherein the one or more edge termination structures comprises at least one portion of one or more III-nitride structures adjacent to the base contact structure, the at least one portion implanted with ions.

14. The semiconductor device of claim 10 wherein the III-nitride emitter structure comprises:
    a first III-nitride epitaxial layer coupled to the surface of the III-nitride base structure, the first III-nitride epitaxial layer having a first dopant concentration; and
    a second III-nitride epitaxial layer coupled to the first III-nitride epitaxial layer, the second III-nitride epitaxial layer having a second dopant concentration;
    wherein the first dopant concentration is less than the second dopant concentration.

15. The semiconductor device of claim 10 wherein the base contact structure comprises a metal layer coupled to the III-nitride material of the base contact structure.

16. A method for fabricating a vertical bipolar transistor, the method comprising:
    providing a first III-nitride layer of a first conductivity type;
    forming at least one III-nitride layer of a second conductivity type coupled to the first III-nitride layer;
    forming a first dielectric layer coupled to the at least one III-nitride layer;
    removing at least a portion of the first dielectric layer and the at least one III-nitride layer to:
       expose a surface of the first III-nitride layer, and
       form a layered structure comprising at least a portion of the at least one III-nitride layer and the first dielectric layer;
    forming a spacer coupled to a sidewall of the layered structure; and
    forming a second III-nitride layer of the first conductivity type coupled to the spacer, the exposed surface of the first III-nitride layer, and the first dielectric layer, such that the first dielectric layer and the spacer are disposed between the second III-nitride layer and the at least one III-nitride layer.

17. The method of claim 16 wherein further comprising:
    removing at least a portion of the second III-nitride layer to expose a surface of the first dielectric layer;
    forming a second dielectric layer coupled to the second III-nitride layer and the first dielectric layer;
    removing at least a portion of the second dielectric layer and the first dielectric layer to expose a surface of the at least one III-nitride layer; and
    forming a metal structure coupled to the exposed surface of the at least one III-nitride layer.

18. The method of claim 16 further comprising forming second III-nitride layer using epitaxial regrowth.

19. The method of claim 16 further comprising forming one or more edge termination structures.

20. The method of claim 16 wherein forming the at least one III-nitride layer comprises:
    forming a third III-nitride epitaxial layer coupled to the first III-nitride layer, the third III-nitride epitaxial layer having a first dopant concentration; and
    forming a fourth III-nitride epitaxial layer coupled to the third III-nitride epitaxial layer, the fourth III-nitride epitaxial layer having a second dopant concentration;
    wherein the first dopant concentration is less than the second dopant concentration.

21. The method of claim 16 further comprising forming a metal layer coupled to the second III-nitride layer.

* * * * *